United States Patent [19]
Ohtsu et al.

[11] Patent Number: 6,122,574
[45] Date of Patent: Sep. 19, 2000

[54] METHOD FOR DETECTING ABNORMALITY OF CONTROL UNIT AND CONTROL UNIT EMPLOYING SAME

[75] Inventors: Nobuyuki Ohtsu; Masaru Yamashita; Hiroshi Tsunehara, all of Kanagawa, Japan

[73] Assignees: Unisia Jecs Corporation, Atsugi; Nissan Motor Co., Ltd., Yokohama, both of Japan

[21] Appl. No.: 09/081,066

[22] Filed: May 19, 1998

[30] Foreign Application Priority Data

May 20, 1997 [JP] Japan ................................. 9-129794

[51] Int. Cl.⁷ ............................... G06F 7/00; G06F 19/00
[52] U.S. Cl. ................................. 701/29; 701/34; 701/66; 702/176; 702/177
[58] Field of Search .................................. 701/24, 29, 34, 701/63, 66, 33, 36, 43; 702/176, 177, 178, 89; 371/61, 62; 711/100, 102, 142, 155

[56] References Cited

U.S. PATENT DOCUMENTS

| 5,525,902 | 6/1996 | Nakajima et al. | 324/212 |
| 5,954,772 | 9/1999 | Akiyama et al. | 701/29 |
| 5,964,813 | 10/1999 | Ishii et al. | 701/29 |

FOREIGN PATENT DOCUMENTS 2-310642  12/1990  Japan .

Primary Examiner—William A. Cuchlinski, Jr.
Assistant Examiner—Gertrude Arthur
Attorney, Agent, or Firm—Foley & Lardner

[57] ABSTRACT

A method of detecting an abnormality of a control unit arranged to execute a writing process and a reading process of data between a CPU and EEPROM. The method measures a time period of the reading process and informs that an abnormality of a system is generated when the reading process time period becomes greater than a predetermined value.

14 Claims, 5 Drawing Sheets

METHOD FOR DETECTING ABNORMALITY OF CONTROL UNIT AND CONTROL UNIT EMPLOYING SAME

BACKGROUND OF THE INVENTION

The present invention relates to a method of detecting an abnormality of a control unit and a control unit employing the method, and more particularly to an abnormality detecting method of a vehicular control unit employing a serial communication type EEPROM.

An anti-skid control apparatus for automatically controlling wheel slip or preventing sustained wheel lock on braking have been developed and been widely used to be highly reliable and safe. The control of such an anti-skid control apparatus is generally executed in such a manner to execute a control program stored in a memory of a control unit. An EEPROM functioning as an external data memory is provided to the control unit and stores various information such as to problems of the anti-skid control apparatus. A microcomputer (CPU) of the control unit reads the data of the EEPROM at the time of the start up of the anti-skid control apparatus and informs the problems to vehicular occupants if such problem exist.

A Japanese Patent Provisional Publication No. 2-310642 discloses an apparatus for preventing a hang-up of a control system caused by a problem of the EEPROM which problem invites the disability to execute a writing process of data from the control unit to the EEPROM. This conventional control apparatus is provided with an EEPROM having a R/B terminal for outputting a write terminating signal to a CPU at the end of the writing processing and the CPU having a time monitoring means for monitoring a time period until the write terminating signal is transmitted to the CPU. The CPU is arranged to terminate the writing process according to the monitored time period even if the write terminating signal is not outputted.

However, the CPU of the conventional apparatus can not detect the abnormality In a reading process of data from the EEPROM to the CPU although it can detect the abnormality in the writing process. Therefore, this conventional apparatus has yet been insufficient at the point of the abnormality detection.

SUMMARY OF THE INVENTION

It is an object of the present invention to provide a method of detecting an abnormality of a control unit and a control unit employing this method, which improves the accuracy of the abnormality detection without complicating a construction of the system.

A first aspect of the present invention resides in a method of detecting abnormality of a control unit including a memory and a microcontroller between which writing and reading of data are executed. The method comprises the steps of: (a) counting a time period from a start of the data reading to an end of the data reading; (b) determining whether the time period of the step (a) Is greater than a predetermined value, and (c) outputting an abnormality detection signal when the time period of the step (a) is greater than the predetermined value.

Another aspect of the present invention resides in an method of detecting abnormality of a control unit including a memory and a microcontroller between which writing and reading of data are executed. The method comprises the steps of: (d) counting a time period from a start of the data writing to an end of the data writing; (e) determining whether the time period of the step (d) is greater than a predetermined value; (g) outputting an abnormality detection signal when the time period of the step (d) is greater than the predetermined value; (h) starting the data reading from the memory to the microcontroller when the time period at the step (d) is smaller than the predetermined value; (a) counting a time period from a start of the data reading to an end of the data reading; (b) determining whether the time period of the step (a) is greater than a predetermined value: and (c) outputting all abnormality detection signal when the time period of the step (a) is greater than the predetermined value.

Further another aspect of the present invention resides In a control unit with an abnormality detecting function which is arranged to execute a writing process and a reading process of data between the control unit and a memory, the control unit comprises a counting means for counting a time period from a start of the data reading to an end of the data reading, a determining means for determining whether the time period is greater than a predetermined value, and an abnormality informing means for outputting an abnormality detection signal when the time period is greater than the predetermined value.

DETAILED DESCRIPTION OF THE INVENTION

Figure 1:
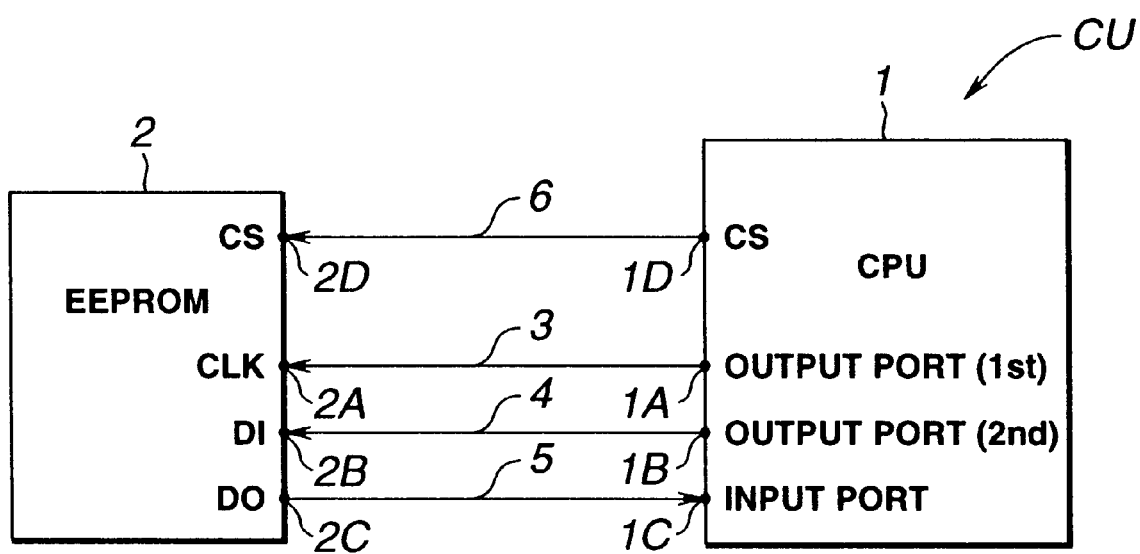
FIG. 1 is a schematic view of a control unit employing a method of detecting the abnormality of the control unit, in accordance with the present invention.

Referring to the drawings, preferred embodiments according to the present invention will be discussed. The preferred embodiments disclose a control unit which is installed on a vehicle and executes an abnormal detection control at the time when an ignition switch is turned on.

(First Embodiment)

Figure 2:
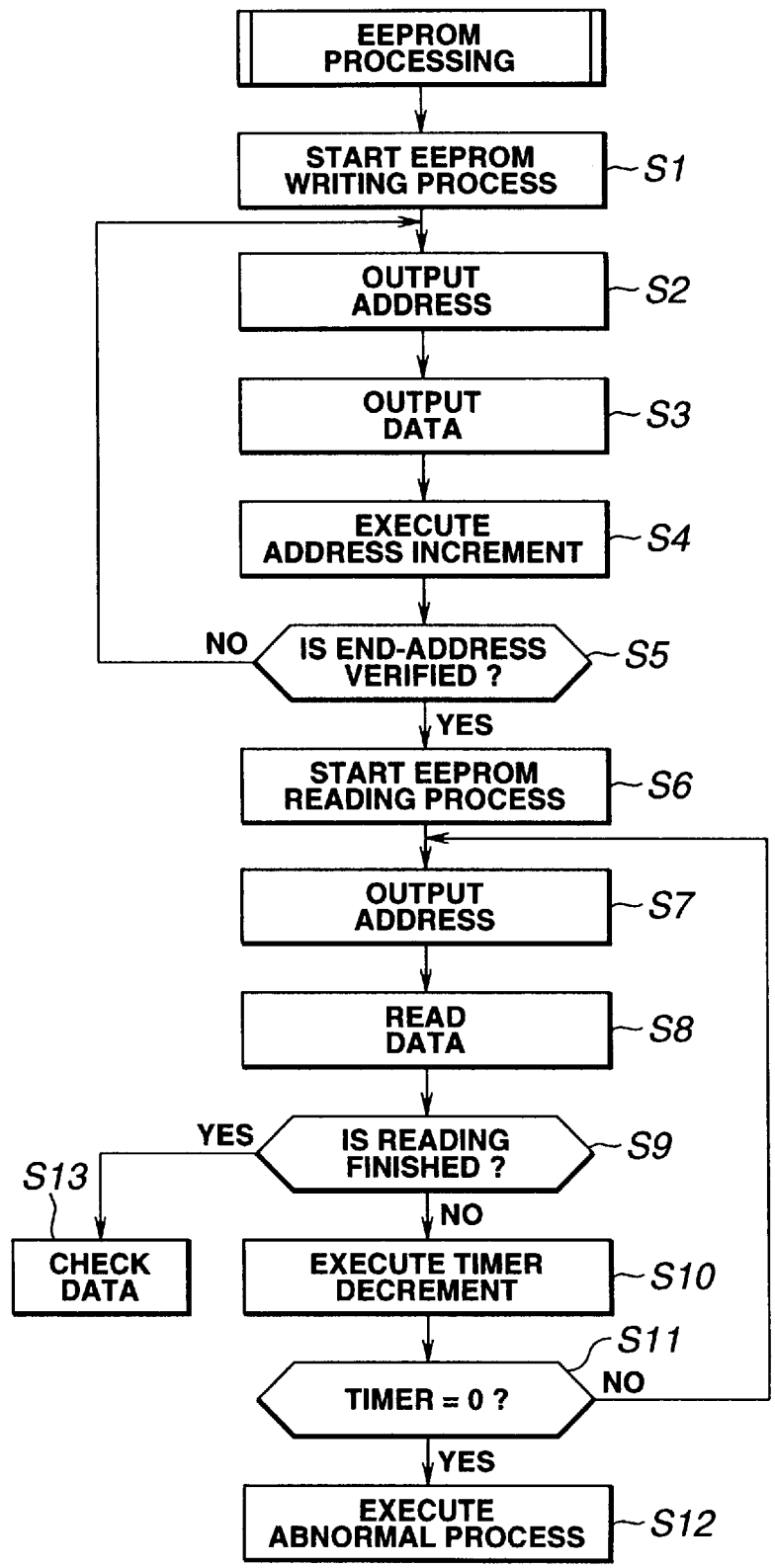
FIG. 2 is a flowchart for an abnormality detecting method of a first embodiment according to the present invention.

Referring to FIGS. 1 and 2, there is shown a first embodiment of a control unit which executes an abnormality detecting control of an EEPROM (Electrically Erasable and Programmable Read Only Memory) 2, in accordance with the present invention.

As shown in FIG. 1, the control unit CU of the first embodiment comprises a CPU (Central Processing Unit) 1 and the EEPROM 2. The CPU 1 comprises a first output port 1A, a second output port 2A, an input port 1C and a clock signal port 1D which-are connected to the EEPROM 2. More particularly, the first output port 1A is connected to a clock port 2A of the EEPROM 2 through a signal wire 3 to transmit a clock signal. The second output port 1B is connected to a data input port ZB of the EEPROM 2 through a signal wire 4 to transmit data from the CPU 1 to the EEPROM 2. The Input port IC is connected to a data output port 2C of the EEPROM 2 through a signal wire to transmit data from the EEPROM 2 to the CPU 1.

The CPU 1 executes the abnormality detection process shown by a flowchart of FIG. 2 and is arranged to continuously execute a writing process and a reading process.

At a step S1, the CPU 1 starts the writing process where the data from the CPU 1 is written In the EEPROM 2.

At a step S2, the CPU 1 outputs an address for writing data in the EEPROM 2.

At a step S3, the CPU 1 outputs the data to be stored at a location addressed by the address outputted at the step S2.

At a step S4, the CPU 1 executes an increment of the address by each output of the data to the EEPROM 2.

At a step S5, the CPU 1 determines as to whether an and-address addressing an end location for storing the data during the writing process Is outputted from the CPU 1 or not. When the determination at the step S5 is affirmative, the routine proceeds to a step S6. When the determination at the step S5 is negative, the routine loops back to the step S2.

At the step S6, the CPU 1 starts a reading process of the EEPROM 2.

At a step S7, the CPU 1 outputs an address for reading data from the EEPROM 2.

At a step S8, the CPU 1 reads the data stored at a location of the EEPROM 2 addressed at the step S7.

At a step S9, the CPU 1 determines as to whether the CPU 1 reads the data of the end-address or not. When the determination at the step S9 Is affirmative, that is, when the CPU 1 read the data of the end-address, the routine jumps to a step S13. When the determination at the step S9 is negative, the routine proceeds to a step S10.

At the step S10, the CPU 1 executes a decrement operation of the address by each output of the data of the EEPROM 2.

At a step S11. the CPU 1 determines as to whether a timer value T of a timer TI is zero or not. When the determination at the step S11 is negative (T≠0), that is, the timer TI Is now executing the subtracting operation of the timer value T, the routine loops back to the step S7 to repeat the data reading. When the determination at the step S11 in affirmative (T=0), the routine proceeds to a step S12. The timer TI is set such that the value thereof is set at a predetermined value, and starts the subtracting operation thereof at the time when the CPU 1 executes the first leading of the address. The subtracting operation of the timer TI is executed by each reading of the address.

At the step S12, the CPU 1 executes an abnormal process which executes a control for informing the abnormality of the EEPROM 2 or predetermined control., which is different from the control executed on the basis of the data of the EEPROM 2, according to the affirmative determination the stop S12.

Next, the manner of operation of the first embodiment according to the present invention will be discussed hereinafter.

In case that the CPU 1 continues the reading of the data from the EEPROM 2 even it a predetermined time period T elapses due to some reasons such as the breakdown of the EEPROM 2 or abnormality of the wires 3, 4 and 5, the CPU I determines that an abnormal condition to execute the abnormal process is generated.

On the other hand, in case that the CPU 1 Can not ensure the time period for reading the data of the EEPROM 2 due to the abnormality of an inner clock of the CPU 1 If the CPU 1 continues the reading of the data from the EEPROM 2 even if a predetermined time period T elapses, the CPU 1 determines that an abnormal condition to execute the abnormal process is generated.

As explained above, the first embodiment is arranged such that the CPU 1 determines the generation of the abnormality on the basis of the reading time period. Therefore, it is possible to detect the generation of the abnormality even when the EEPROM 2 is broken down or even when each of the signal wires 3, 4 and 5 goes wrong or abnormal.

Further, the first embodiment according to the present invention may not include a construction for outputting an end-code indicative that the end data is written in the EEPROM 2 from the CPU 1, or construction for outputting the end-code from the EEPROM 2 to the CPU 1. This enables the control unit CU according to the present invention to be largely simplified in construction and In control.

(Second Embodiment)

Figure 3:
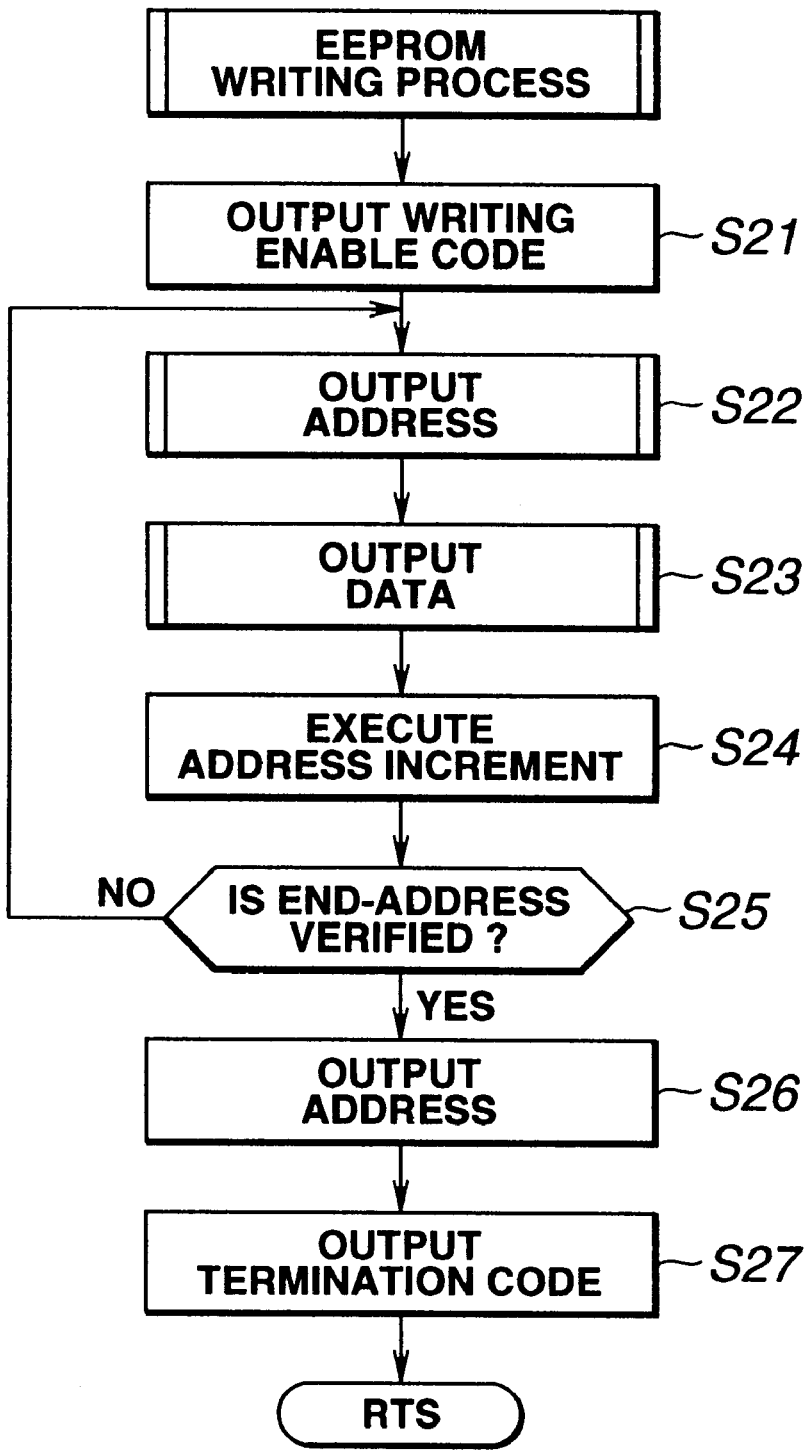
FIG. 3 is a flowchart for a writing process executed in a second embodiment according to the present invention.
Figure 4:
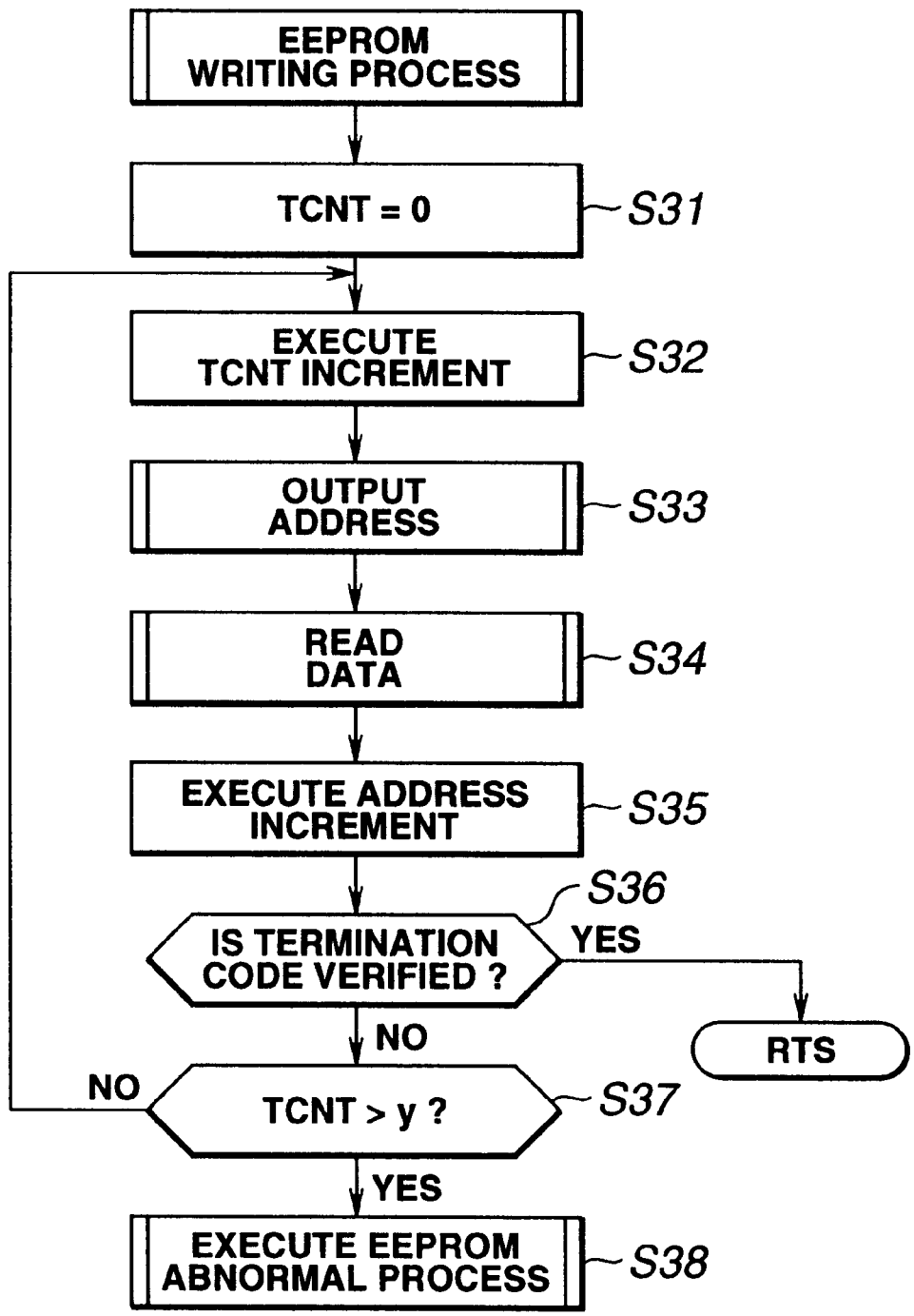
FIG. 4 i s a flowchart for a reading process executed in the second embodiment according to the present invention.

Referring to FIGS. 3 and 4, there is shown a second embodiment of the control unit CU which executes an abnormality detecting control of the control unit CU, in accordance with the present invention. The connection structure between the CPU 1 and the EEPROM 2 of the second embodiment is the same as that of the first embodiment. Therefore, numerical designations used in FIG. 1 are also used in the second embodiment, and the explanations thereof will be omitted herein. Only the abnormal detection control executed by the CPU 1 will discussed hereinafter. The second embodiment according to the present invention is arranged to independently execute the writing process and the reading process.

With reference to FIG. 3, the writing process will be discussed.

At a step S21, the CPU 1 outputs a write enable code to the EEPROM 2.

At a step S22, the CPU 1 outputs an address to the EEPROM 2.

At a step S23, the CPU 1 outputs data at a location in the EEPROM 2 addressed at the step S22.

At a step S24, the CPU 1 executes the address increment by a predetermined value such as 1.

At a step S25, the CPU 1 determines as to whether an end-address is verified or not. When the determination at the step S25 is negative, the routine loops back to the step S22 to repeat the steps S22, S23, S24 and S25. When the determination at the step S25 is affirmative, the routine proceeds to a step S26.

At the step S26, the CPU 1 outputs an address next to the end-address to the EEPROM 2.

At the step S27, the CPU 1 outputs a termination-code to a location addressed at the step S26.

S Following to the execution of the step S27, the routine returns to the start.

Next, with reference to FIG. 4, the reading process will be discussed.

At a step S31, the CPU 1 resets a measured time TCNT of a timer T2 at zero (TCNT=0).

At a step S32, the CPU 1 executes the increment of the measured time TCNT of the timer T2.

At a step S33, the CPU 1 outputs address to the EEPROM 2.

At a step S34, the CPU 1 outputs data stored at a location addressed by the address designated at the step S33 in the EEPROM 2.

At a step S35, the CPT 1 executes the increment of the address by a predetermined value such as 1.

At a step S36, the CPU 1 determines as to whether the termination code is verified or not.

When the determination at the step S36 is affirmative, that is, when the EEPROM 2 read all of the data from the CPU 1 and when the termination code is verified, the routine proceeds to a RST block where the routine is temporally terminated. When the determination at the step S36 is negative, that is, when the termination code is not verified, the routine proceeds to a step S37.

At the step S37, the CPU 1 determines as to whether the measured value TCNT of the timer T2 Is greater than a value y or not. When the determination at the step S37 is negative (TCNT≦y), the routine loops back to the step 32 to repeat the above-mentioned steps. When the determination at the step S37 is affirmative (TCNT>y), the routine proceeds to a step S38.

At the step S38, the CPU 1 executes the EEPROM abnormal process.

The second embodiment is arranged such that in the writing process the termination code is written in a location addressed by an address next to the end-address storing the end data. Thereafter, when the CPU 1 executes the reading process, this reading process is continued until the termination code is verified. If the termination code is verified before the measured value TCNT of the timer T2 becomes greater than the predetermined value y, the CPU 1 determines that the reading process is normally executed, and therefore the control unit including the CPU 1, the EEPROM 2 and the wires 3, 4 and 5 is normal. If the termination code is not verified even when the measured value TCNT of the timer T2 becomes greater than the predetermined value y, the CPU 1 determines that the control unit Including the CPU 1, the EEPROM 2 and the wires 3, 4 and 5 is abnormal.

On the basis of this determination of the abnormality of the control unit CU, the CPU 1 executes the abnormal process for informing the abnormality of the control unit CU to users so that users note that the control unit CU goes wrong and it is necessary to temporarily stop the control unit CU and repair the 30 same.

If the control unit CU employs a learning function of control parameters, the arrangement according to the present invention functions to prevent problems that the learning operation is not executed under an initial condition and that the maintenance ability of the control unit is degraded due to the impossibility to detect the abnormal point.

(Third Embodiment)

Figure 5:
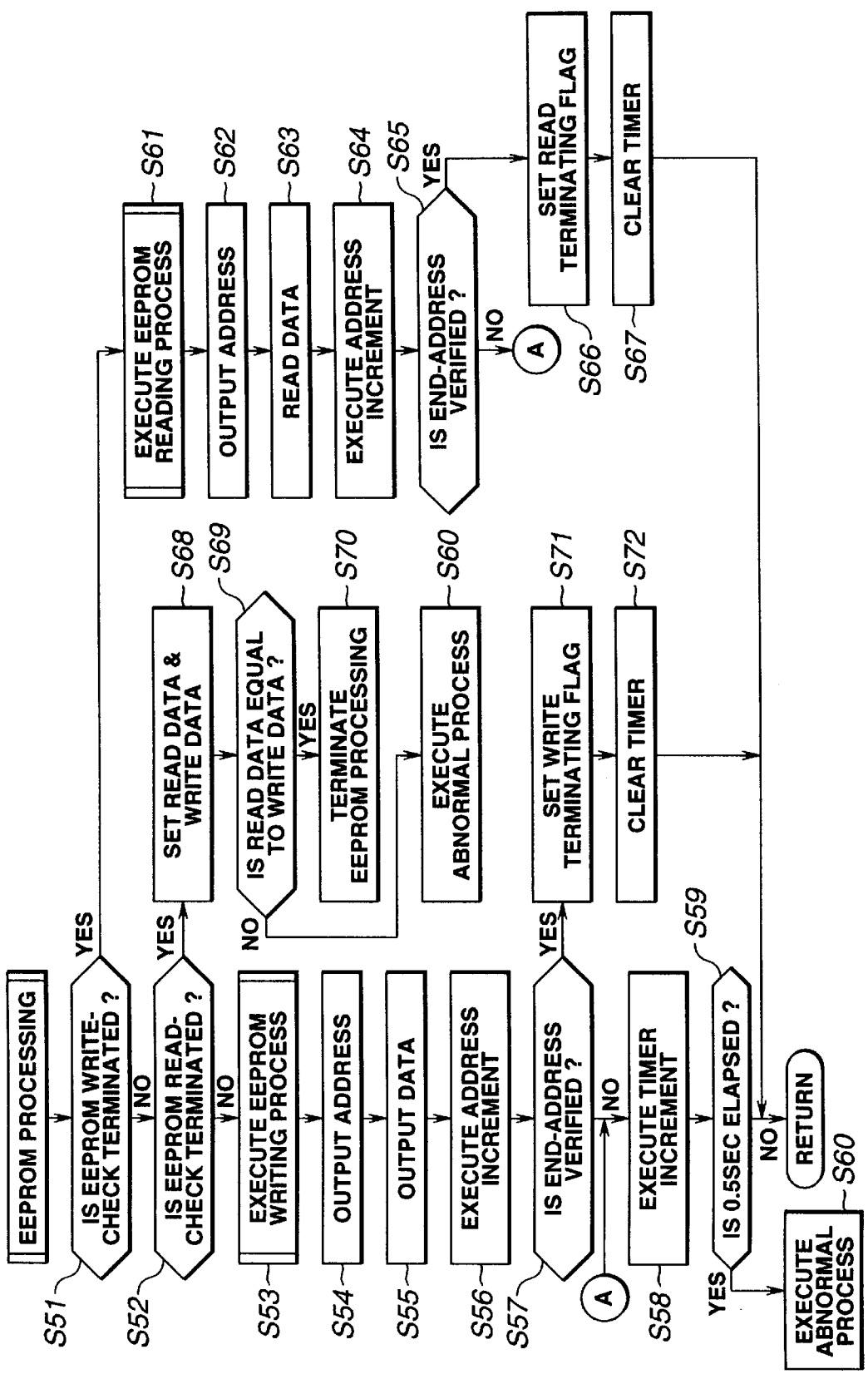
FIG. 5 is a flowchart for an abnormality detecting method including the writing and reading processes according to the present invention.

Referring to FIG. 5, there is shown a third embodiment of the control unit CU which executes an abnormality detecting control of the control unit CU, in accordance with the present invention. The connection structure of the third embodiment is the same as that of the first embodiment. Therefore, numerical designations used in FIG. 1 are also used in the third embodiment, and the explanations thereof will be omitted herein. Only the abnormal detection control executed by the CPU 1 will discussed hereinafter.

FIG. 5 shows a flowchart of the abnormality detecting control executed in the third embodiment according to the present Invention. When this routine is started, a write terminating flag, a read terminating flag and a timer are reset.

At a step S51, the CPU 1 determines as to whether a write check of the EEPROM 2 is terminated or not. When the determination at the step S51 is affirmative, the routine jumps to a step S61. When the determination at the step S51 is negative, the routine proceeds to a step S52. Therefore, when this routine is first executed the step S51, the routine proceeds to the step S52.

At the step S52, the CPU 1 determines as to whether a read check of the EEPROM 2 is terminated or not. When the determination at the step S52 is affirmative, the routine jumps to a step S68. When the determination at the step S52 is negative, the routine proceeds to a step S53. Therefore, when this routine is first executed the step S52, the routine proceeds to the step S53.

At the step S53, the CPU 1 starts to execute the writing process to the EEPROM 2.

At a step S54, the CPU 1 outputs an address to the EEPROM 2.

At a step S55, the CPU 1 outputs data to stored at a location addressed by the address designated at the step S33 in the EEPROM 2.

At a step S56, the CPU 1 executes an address increment by a predetermined value such as 1.

At a step S57, the CPU 1 determines as to whether the writing of the data to the addressed location of the EEPROM 2 is completed until the end address or not. When the determination at the step S57 is affirmative, that is, when the writing of all data to the EEPROM 2 is completed, the routine proceeds to a step S71. When the determination at the step S57 is negative, that is, when the writing of all data to the EEPROM 2 is not completed, the routine proceeds to a step S58.

At the step S58, the CPU 1 counts up a timer T3.

At a step S59, the CPU 1 determines as to whether or not the measured time of the timer T3 is greater than a predetermined time period such as 0.5 second, when the determination at the step S59 is affirmative. That is, when the measured time of the timer T3 Is greater than 0.5 second, the routine proceeds to a step S60 wherein the CPU 1 executes the abnormal process. When the determination at the step S59 is negative, that is, when the measured time of the timer T3 is not greater than 0.5 second, the routine loops back to the step S51 to repeat the above-mentioned steps S51 to S59.

On the other hand, when the routine proceeds to the step S71 according to the affirmative determination at the step S57, the CPU 1 sets the write termination flag at the step S71.

Following to the execution at the step S71, the routine proceeds to a step S72 where the CPU 1 clears the timer T2. Then, the routine returns to the step S51.

If the writing of the data to the EEPROM 2 is completed within 0.5 second, the determination at the step S51 becomes affirmative and therefore the routine proceeds to the step S61.

At the step S61, the CPU 1 starts the reading process for reading the data in the EEPROM 2.

At a step S62, the CPU 1 outputs an address to the EEPROM 2.

At a step S63, the CPU 1 outputs data to stored at a location in the EEPROM 2 addressed at the stop S62.

At a step S64, the CPU 1 executes an address Increment by 1.

At a step S65, the CPU 1 determines as to whether the end-address is verified or not. When the determination at the step S65 is negative, the routine proceeds to a step S66.

At the step S66, the CPU 1 sets the read termination flag.

At a step S67, the CPU 1 clears the timer T2. Then, the routine returns to the step S51. Therefore, at the step S52 In the next routine, the CPU 1 determines that the read check of the EEPROM 2 is terminated. Therefore, the routine proceeds to the step S68. At the step S68, the CPU 1 sets the read data from the EEPROM 2 and the write date of the CPU 1, At the step S69, the CPU 1 determines as to whether the read data is equal to the write data or not. When the determination at the step S69 is affirmative, the routine proceeds to a step S70 where the EEPROM processing is terminated. When the determination at the step S69 is negative., the routine proceeds to a step S60 where the abnormal process is executed.

With the thus arranged third embodiment, it is possible to detect the abnormal condition of the EEPROM 2 during writing and reading processes and the signal wires. This largely improves the detection accuracy as to the abnormalities.

The entire disclosure of Japanese Patent Application No. P9-129794 filed on May. 20, 1997 including specification, claims, drawings and summary are incorporated herein by reference in its entirety.

What is claimed is:

1. A method of detecting abnormality of control unit including a memory and a microcontroller between which writing and reading of data are executed, the method comprising the steps of:

(a) counting a time period from a start of the data reading to an end of the data reading;

(b) determining whether the time period of the step (a) is greater than predetermined value; and (c) outputting an abnormality detection signal when the time period of the step (a) is greater than the predetermined value.

2. A method as claimed in claim 1, wherein the step (b) includes determining whether data is read in a location addressed by an end address.

3. A method as claimed in claim 1, further comprising a step for executing an abnormal control routine when the abnormality detection signal is outputted.

4. A method as claimed in claim 1, further comprising a step for shutting down a control of a system executed by the control unit when the abnormality detection signal is outputted.

5. A method as claimed in claim 1, wherein the steps of the method is started when a power source of a system controlled by the control unit is turned on.

6. A control unit as claimed in claim 1, wherein the abnormality detecting process is started when a power source of a system controlled by the control unit is turned on.

7. A method of detecting abnormality of a control unit including a memory and a microcontroller between which writing and reading of data are executed, the method comprising the steps of:

(a) counting a time period from a start of the data writing to an end of the data writing;

(b) determining whether the time period of the step (a) is greater than a predetermined value;

(c) outputting an abnormality detection signal when the time period of the step (a) is greater than the predetermined value;

(d) starting the data reading from the memory to the microcontroller when the time period at the step (a) is smaller than the predetermined value;

(e) counting a time period from a start of the data reading to an end of the data reading;

(f) determining whether the time period of the step (e) is greater than a predetermined value; and (g) outputting an abnormality detection signal when the time period of the step (e) is greater than the predetermined value.

8. A method as claimed in claim 7, wherein the step (f) includes outputting a terminating code when the data is written on the addressed memory until a location addressed by the end address, and the step (b) includes determining whether the terminating code is verified during the data reading process.

9. A control unit with an abnormality detecting function arranged to execute a writing process and a reading process of data between the control unit and a memory, the control unit comprising:

a counting means for counting a time period from a start of the data reading to an end of the data reading;

a determining means for determining whether the time period is greater than a predetermined value; and an abnormality informing means for outputting an abnormality detection signal when the time period is greater than the predetermined value.

10. A control unit as claimed in claim 9, wherein said determining means determining whether data is read in a location addressed by an end address.

11. A control unit as claimed in claim 9, further comprising an abnormal control executing means for executing an abnormal control routine when the abnormality detection signal is outputted.

12. A control unit as claimed in claim 9, further comprising a shutting down means for shutting down a control of a system executed by the control unit when the abnormality detection signal is outputted.

13. A control unit with an abnormality detecting function of detecting abnormality of a control unit, the control unit including a memory and a microcontroller between which writing and reading of data are executed, the control unit comprising:

a writing period counting means for counting a time period from a start of the data writing to an end of the data writing;

a first determining means for determining whether the writing period is greater than a predetermined value;

a writing abnormality informing means for outputting a writing abnormality detection signal when the time period of is greater than the predetermined value;

a reading starting means for starting the data reading from the memory to the microcontroller when the writing period is smaller than the predetermined value;

a reading period counting means for counting a time period from a start of the data reading to an end of the data reading;

a second determining means for determining whether the reading period Is greater than a predetermined value; and a reading abnormality informing means for outputting a reading abnormality detection signal when the writing period is greater than the predetermined value.

14. A control unit as claimed in claim 13, wherein said second determining means outputs a terminating code when the data is written on the addressed memory until a location addressed by the end address, and said first determining means determines whether the terminating code is verified during the data reading process.

* * * * *